United States Patent
Baptiste

(10) Patent No.: US 8,310,008 B2
(45) Date of Patent: Nov. 13, 2012

(54) ELECTRONIC DEVICE INCLUDING A GATE ELECTRODE HAVING PORTIONS WITH DIFFERENT CONDUCTIVITY TYPES

(75) Inventor: Burchell B. Baptiste, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/844,392

(22) Filed: Jul. 27, 2010

(65) Prior Publication Data

US 2010/0289072 A1 Nov. 18, 2010

Related U.S. Application Data

(62) Division of application No. 12/020,316, filed on Jan. 25, 2008, now Pat. No. 7,785,973.

(51) Int. Cl.
*H01L 29/76* (2006.01)
*H01L 21/265* (2006.01)

(52) U.S. Cl. ........ 257/344; 257/315; 257/316; 257/317; 257/365; 257/366; 257/E21.434; 257/E21.682; 257/E27.103; 257/E29.309; 438/257; 438/267; 438/306; 438/596

(58) Field of Classification Search .................. 257/315, 257/316, 317, 344, 364, 366, 434, E21.682, 257/E27.103, E29.309; 438/257, 267, 306, 438/596
See application file for complete search history.

(56) References Cited

U.S. PATENT DOCUMENTS

| | | | |
|---|---|---|---|
| 4,714,519 A * | 12/1987 | Pfiester | 438/304 |
| 5,352,914 A * | 10/1994 | Farb | 257/345 |
| 5,593,909 A * | 1/1997 | Han et al. | 438/306 |
| 5,600,168 A * | 2/1997 | Lee | 257/336 |
| 5,753,952 A | 5/1998 | Mehrad | |
| 5,977,591 A * | 11/1999 | Fratin et al. | 257/344 |
| 6,093,945 A * | 7/2000 | Yang | 257/317 |
| 2005/0035393 A1 * | 2/2005 | Lung et al. | 257/314 |

OTHER PUBLICATIONS

M. Janai, "Data Retention Reliability Model of Nrom Nonvolatile Memory Products", IEEE Transactions on Device and Materials Reliability, vol. 4, pp. 404-415, 2004.
E. Lusky, "Retention Loss Characteristic of Localized Charge-Trapping Devices", IEEE International Reliability Physics Symposium, pp. 1-4, Apr. 2004.
S. Wolf, Silicon Processing for the VLSI Era, vol. I, pp. 292-293, Lattice Press, 1986.

* cited by examiner

*Primary Examiner* — Dao H Nguyen

(57) ABSTRACT

An electronic device can include a gate electrode having different portions with different conductivity types. In an embodiment, a process of forming the electronic device can include forming a semiconductor layer over a substrate, wherein the semiconductor layer has a particular conductivity type. The process can also include selectively doping a region of the semiconductor layer to form a first doped region having an opposite conductivity type. The process can further include patterning the semiconductor layer to form a gate electrode that includes a first portion and a second portion, wherein the first portion includes a portion of the first doped region, and the second region includes a portion of the semiconductor layer outside of the first doped region. In a particular embodiment, the electronic device can have a gate electrode having edge portions of one conductivity type and a central portion having an opposite conductivity type.

18 Claims, 12 Drawing Sheets

US 8,310,008 B2

ELECTRONIC DEVICE INCLUDING A GATE ELECTRODE HAVING PORTIONS WITH DIFFERENT CONDUCTIVITY TYPES

CROSS-REFERENCE TO RELATED APPLICATIONS

This is a divisional application of and claims priority under 35 U.S.C. §120 to U.S. patent application Ser. No. 12/020,316 entitled "Electronic Device Including a Gate Electrode Having Portions with Different Conductivity Types and a Process of Forming the Same," by Baptiste, filed Jan. 25, 2008, which is assigned to the current assignee hereof and incorporated herein by reference in its entirety.

BACKGROUND

1. Field of the Disclosure

This disclosure relates to electronic devices and processes, and more particularly, to electronic devices including gate electrodes having portions with different conductivity types and processes of forming them.

2. Description of the Related Art

A nonvolatile memory cell can include a mirror bit memory cell. The mirror bit memory cell typically includes a silicon nitride layer that traps charges. During programming hot electrons can be injected into the silicon nitride layer, and during erasing, hot holes can be injected into the silicon nitride layer to get the net charge closer to zero. After many programming and erasing cycles, the electron and hole distributions can become miss-matched. Electrons trapped in the nitride tend to spread laterally in the channel direction, while the holes remain closer to the source/drain overlap region. The resulting miss-match between electron and hole distributions produces a dipole field. Excess trapped holes propelled by the dipole field move towards the channel region where, over time, they neutralize trapped electrons resulting in charge loss. This occurrence limits the reliability of the mirror-bit memory cell.

BRIEF DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

An electronic device can include a gate electrode having different portions with different conductivity types. In an embodiment, a process of forming the electronic device can include forming a semiconductor layer over a substrate having a primary surface, wherein the semiconductor layer has a first conductivity type. The process can also include selectively doping a region of the semiconductor layer to form a first doped region having a second conductivity type opposite that of the first conductivity type. The process can further include patterning the semiconductor layer to form a gate electrode that includes a first portion and a second portion, wherein the first portion includes a portion of the first doped region, and the second region includes a portion of the semiconductor layer outside of the first doped region.

In another embodiment, the electronic device can include a first source/drain region, a second source/drain region spaced apart from the first source/drain region, and a channel region disposed between the first and second source drain regions. The electronic device can include a gate electrode having a first edge portion, a second edge portion, and a central portion disposed between the first and second edge portions, wherein the central portion has a first conductivity type, and the first and second edge portions have a second conductivity type opposite the first conductivity type the central portion is disposed over the channel region the first edge region is at least partly disposed over the first source/drain region, and the second edge region is at least partly disposed over the second source/drain region.

Attention is now directed to processes of forming an electronic device that includes polishing dissimilar conductive layers over an interlevel dielectric. The information herein is provided to aid in understanding particular details, and is not to limit the present invention.

Figure 1:
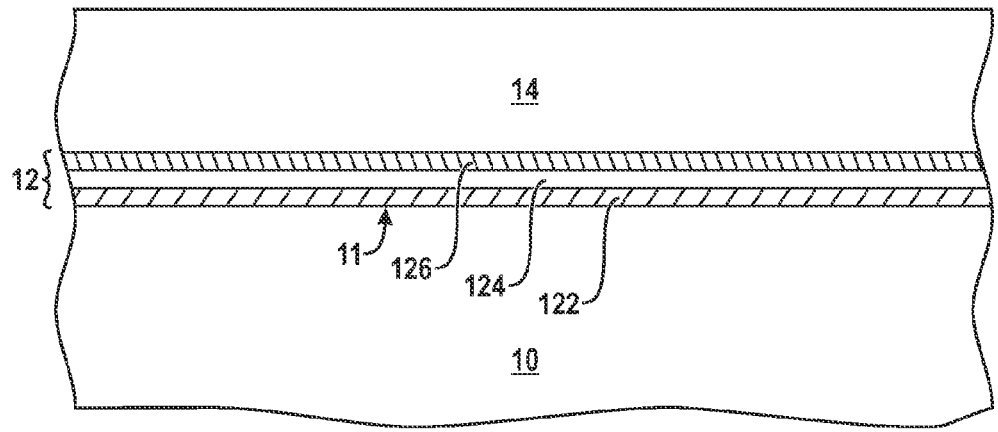
FIG. 1 includes an illustration of a cross-sectional view of a portion of a workpiece after forming charge storage stack and a semiconductor layer over a substrate.

FIG. 1 includes an illustration of a cross-sectional view of a portion of a workpiece that includes a substrate 10. The substrate 10 can include a monocrystalline semiconductor wafer, a semiconductor-on-insulator wafer, or other substrate used to form electronic devices. The substrate 10 can include silicon, germanium, carbon, or any combination thereof and an n-type dopant or a p-type dopant. The substrate 10 has a primary surface 11.

A charge storage stack 12 is formed over the substrate 10 and includes a gate dielectric layer 122, a charge storage layer 124, and an insulating layer 126. The gate dielectric layer 122 can include silicon dioxide or a high-k (dielectric constant greater than 8) material, such as hafnium oxide, zirconium oxide, another suitable high-k oxide material, or any combination thereof. The gate dielectric layer 122 can act as a gate dielectric layer. In an embodiment, the gate dielectric layer 122 may have a thickness no greater than approximately 20 nm, 15 nm, or 12 nm, and in another embodiment, the gate dielectric layer 122 may have a thickness of at least approximately 1 nm, 3 nm, or 5 nm. In a particular embodiment, the gate dielectric layer 12 has a thickness in a range of approximately 5 nm to approximately 9 nm.

The charge storage layer 124 helps to store charge within nonvolatile memory cells. In an embodiment, the charge storage layer 124 can include a nitride layer. The thickness of the charge storage layer 124 can be any of the thicknesses previously described with respect to the gate dielectric layer 122. The charge storage layer 124 and the gate dielectric layer 122 can have the same thickness or different thicknesses. The insulating layer can include any of the compositions and thicknesses and can be formed using any of the techniques described with respect to the gate dielectric layer 122. The compositions, thicknesses, and formation techniques for the gate dielectric layer 122 and insulating layer 126 may be the same or different. The gate dielectric layer 122, silicon nitride layer 124, and the insulating layer 126 can be formed by conventional or proprietary growth or deposition techniques.

A semiconductor layer 14 is formed over the charge storage stack 12. The semiconductor layer 14 can include silicon, germanium, carbon, or any combination thereof. In an embodiment, the semiconductor layer 14 can have a thickness no greater than approximately 900 nm, 500 nm, or 200 nm, and in another embodiment, the semiconductor layer 14 can have a thickness of at least approximately 20 nm, 50 nm, or 100 nm. In a particular embodiment, the semiconductor layer 14 has a thickness in a range of approximately 100 nm to approximately 150 nm. The semiconductor layer 14 can be formed using a conventional or proprietary deposition technique.

Figure 2:
FIG. 2 includes an illustration of a cross-sectional view of the workpiece of FIG. 1 when doping the semiconductor layer.
Figure 2:
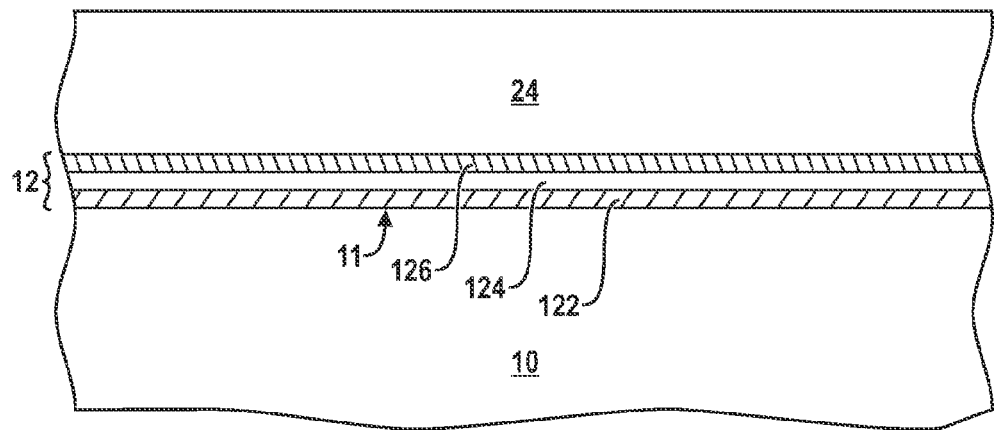
Figure 3:
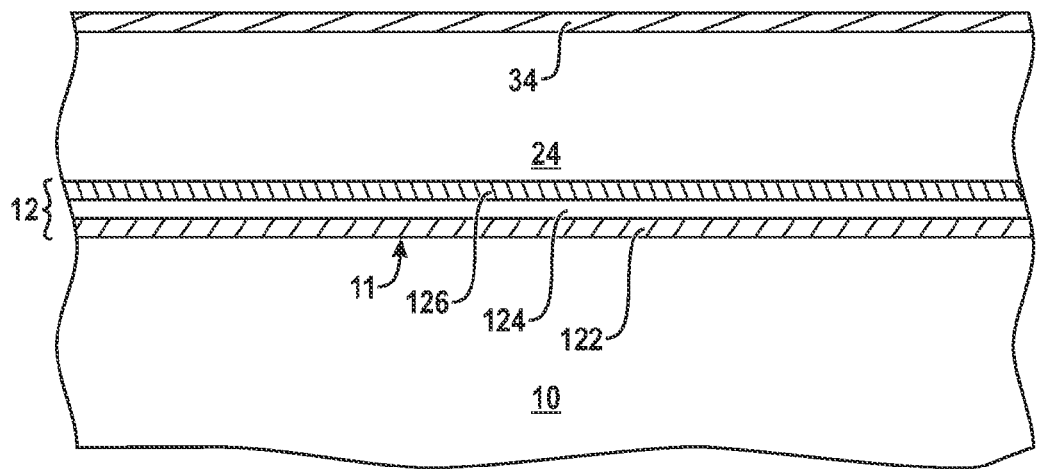
FIG. 3 includes an illustration of a cross-sectional view of the workpiece of FIG. 2 after forming a hard mask layer.

The semiconductor layer 14 can be doped to become a doped semiconductor layer 24, as illustrated in FIG. 2. In one embodiment, the doped semiconductor layer 24 can be formed by ion implanting the semiconductor layer 14 with a dopant having the same conductivity type as the substrate. In a particular embodiment, the substrate 10 is p-type doped, and the ions include $B^+_{11}$, $BF_2^+$, or the like. In another particular embodiment, the dose may be no greater than approximately $5E15$ ions/cm$^2$, $3E15$ ions/cm$^2$, or $1E15$ ions/cm$^2$, and in another embodiment, the dose can be at least approximately $1E13$ ions/cm$^2$, $5E13$ ions/cm$^2$, or $1E14$ ions/cm$^2$. In a particular embodiment, the dose can be in a range of approximately $1E14$ ions/cm$^2$ to approximately $1E15$ ions/cm$^2$. When the ions include $BF_2^+$, the implant energy may be no greater than approximately 30 keV, 25 keV, or 20 keV, and in another embodiment, the implant energy can be at least approximately 3 keV, 5 keV, or 10 keV. In a particular embodiment, the implant energy can be in a range of approximately 10 keV to approximately 20 keV. When the ions include $B^+_{11}$, the implant energy may be lower than it is for $BF_2^+$. After reading this specification, skilled artisans will be able to determine an implant energy for a particular ionic species to achieve the desired projected range. The ion implantation can be performed using a conventional or proprietary technique.

In another embodiment, the doped semiconductor layer 24 can be formed by a furnace dopant technique. In a further embodiment, the doped semiconductor layer 24 can be formed using an in-situ doped semiconductor deposition technique. If the doped semiconductor layer is deposited as an in-situ doped layer, separate deposition and doping acts are not required.

A hard mask layer 34 can be formed over the doped semiconductor layer 24. The hard mask layer 34 can include a nitride or an oxynitride. In a particular embodiment, the hard mask layer 34 can include silicon oxynitride, silicon-rich silicon nitride, titanium nitride, or any combination thereof. The hard mask layer can have a thickness no greater than approximately 300 nm, 200 nm, or 150 nm, and in another embodiment, the semiconductor layer 14 can have a thickness of at least approximately 10 nm, 20 nm, or 50 nm. In a particular embodiment, the hard mask layer 24 has a thickness in a range of approximately 50 nm to approximately 120 nm.

In another embodiment, the hard mask layer 34 can act as an antireflective layer or a separate antireflective layer (not illustrated) may be used in conjunction with or in place of the hard mask layer 34. The hard mask layer 34 can be formed using a conventional or proprietary deposition technique.

Figure 4:
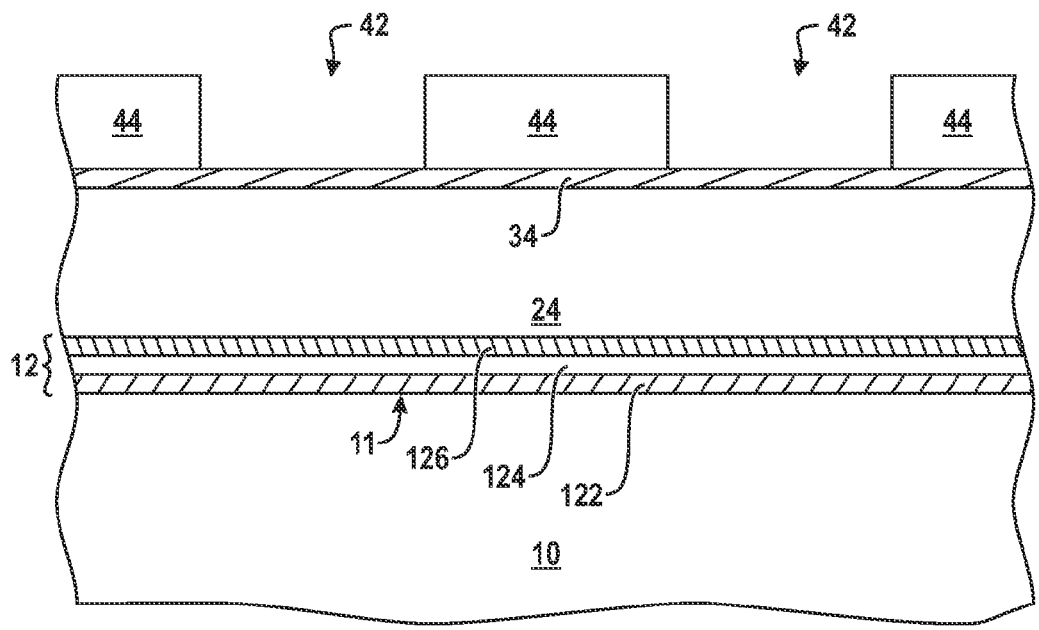
FIG. 4 includes an illustration of a cross-sectional view of the workpiece of FIG. 3 after a forming patterned mask layer.

Another mask layer is formed over the hard mask layer 34 and patterned to form mask features 44 and openings 42 defined by edges of the mask features 44, as illustrated in FIG. 4. The other mask layer used for forming the mask features 44 can include an organic resist material. The formation and patterning of the mask layer to form the mask features 44 is performed using conventional or proprietary techniques.

Figure 5:
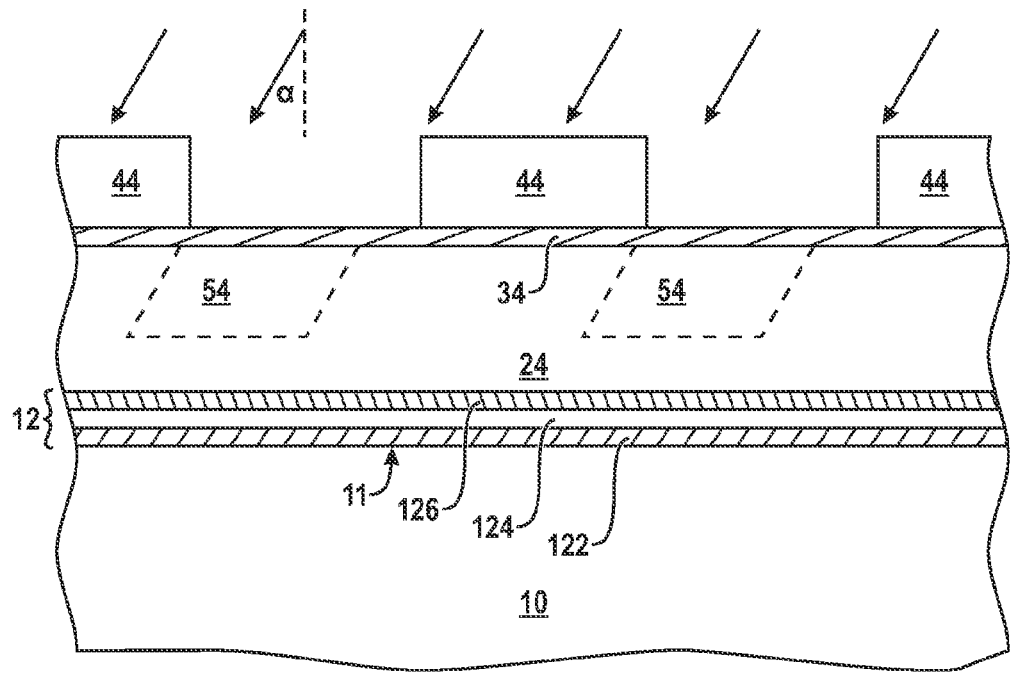
FIG. 5 includes an illustration of a cross-sectional view of the workpiece of FIG. 4 when implanting the semiconductor layer at a first angle.

FIG. 5 includes an illustration of a cross-sectional view when during an ion implantation of the doped semiconductor layer 24. The ion implantation is performed at an angle α to implant portions 54 of the doped semiconductor layer 24 under the mask features 44. The angle α, which is measured from a direction perpendicular to the primary surface 11, may be no greater than approximately 60°, 45°, or 30°, and in another embodiment, the angle α can be at least approximately 8°, 15°, or 20°. In a particular embodiment, the angle can be in a range of approximately 20° to approximately 30°.

The ions include a dopant having a conductivity type opposite that of the substrate 10, the doped semiconductor layer 24 or both. In an embodiment, the dopant can include $P^+_{31}$, $As^+_{75}$, or the like. In a particular embodiment, the dose may be no greater than approximately $5E16$ ions/cm$^2$, $1E16$ ions/cm$^2$, or $5E15$ ions/cm$^2$, and in another embodiment, the dose can be at least approximately $1E14$ ions/cm$^2$, $5E14$ ions/cm$^2$, or $1E15$ ions/cm$^2$. In a particular embodiment, the dose can be in a range of approximately $1E15$ ions/cm$^2$ to approximately $5E15$ ions/cm$^2$. When the ions include $P^+_{31}$, the implant energy may be no greater than approximately 30 keV, 25 keV, or 20 keV, and in another embodiment, the implant energy can be at least approximately 1 keV, 3 keV, or 5 keV. In a particular embodiment, the implant energy can be in a range of approximately 10 keV to approximately 20 keV. When the ions include $As^+_{75}$, the implant energy may be higher than it is for $P^+_{31}$. After reading this specification, skilled artisans will be able to determine an implant energy for a particular ionic species to achieve the desired projected range. The ion implantation is performed using a conventional or proprietary technique.

Figure 6:
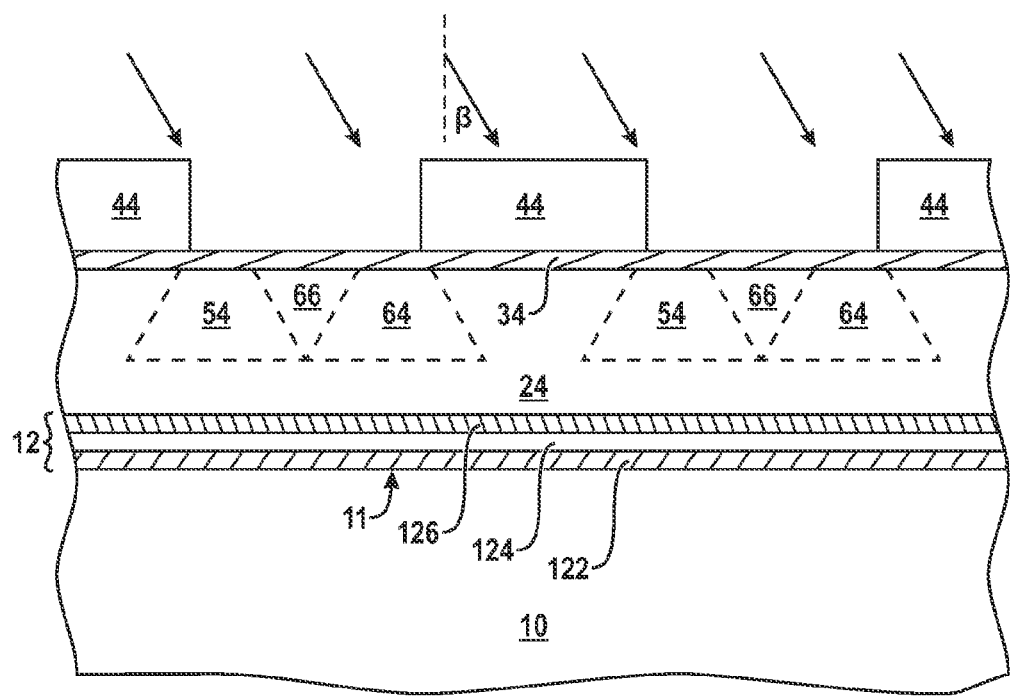
FIG. 6 includes an illustration of a cross-sectional view of the workpiece of FIG. 5 when implanting the semiconductor layer at a second angle.

FIG. 6 includes an illustration of a cross-sectional view when during another ion implantation of the doped semiconductor layer 24. This other ion implantation is performed at an angle β to implant portions 64 and 66 of the doped semiconductor layer 24 under the mask features 44. The portion 66 includes dopant implanted during both ion implantations. The angle β, which is measured from a direction perpendicular to the primary surface 11, may be any angle as described with respect to the angle α. The angle β may be the same as or different from the angle α. The ions include a dopant having a conductivity type opposite that of the substrate 10, the doped semiconductor layer 24 or both. The ionic species, dose, and implant energy during the ion implantation as illustrated in FIG. 6 can use any of the ions, dose, and implant energy as described for the ion implantation as illustrated in FIG. 5. The ionic species, dose, implant energy, or any combination thereof during the ion implantation as illustrated in FIG. 6 may be the same as or different from the ionic species, dose, implant energy, or any combination thereof for the ion implantation as illustrated in FIG. 5.

In another embodiment (not illustrated), a single ion implantation, rather than a plurality of ion implantations, may be performed while the substrate is rotating.

Figure 7:
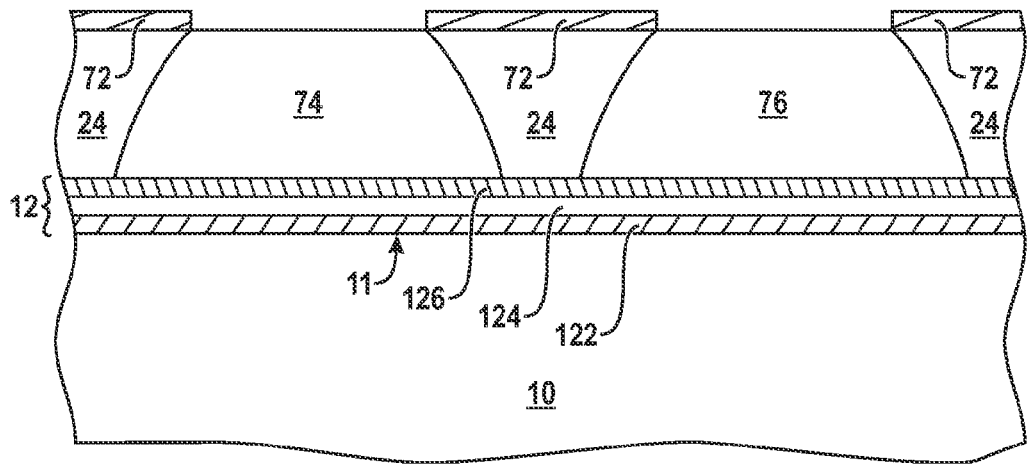
FIG. 7 includes an illustration of a cross-sectional view of the workpiece of FIG. 6 after patterning the hard mask layer.

The hard mask layer 34 is patterned to form mask features 72, as illustrated in FIG. 7, and the mask features 44 (not illustrated in FIG. 7) are then removed. The hard mask layer 34 can be patterned by selectively etching the hard mask layer 34 using a fluorine-containing gas. The etching can be performed as a timed etch, using endpoint detection (without a timed overetch), using endpoint detection and a timed overetch, or the like. Referring to FIG. 6, the endpoint detection can be triggered when the implanted regions 54, 64, 66, or any combination thereof become exposed. The etching can be performed using conventional or proprietary technique. The mask feature 44 can be removed using a convention or proprietary ashing process.

An optional anneal can be performed to activate, diffuse, migrate, or any combination thereof dopant within the implanted regions 54, 64, and 66 (in FIG. 6) to form the doped regions 74 and 76 in FIG. 7. The anneal may be performed so that some of the dopant (from the ion implantations) migrates to the interface of the charge storage stack, so that the dopant becomes the majority carrier within the doped regions 74 and 76 at interface with the charge storage stack 12. A portion of the doped semiconductor layer 24, outside of the doped regions 74 and 76, still abuts the charge storage stack 12. Thus, the anneal is not performed at a time and temperature that would cause the doped regions 74 and 76 to merge together and completely displace the portion of the doped semiconductor layer 24 outside of the doped regions 74 and 76.

Figure 8:
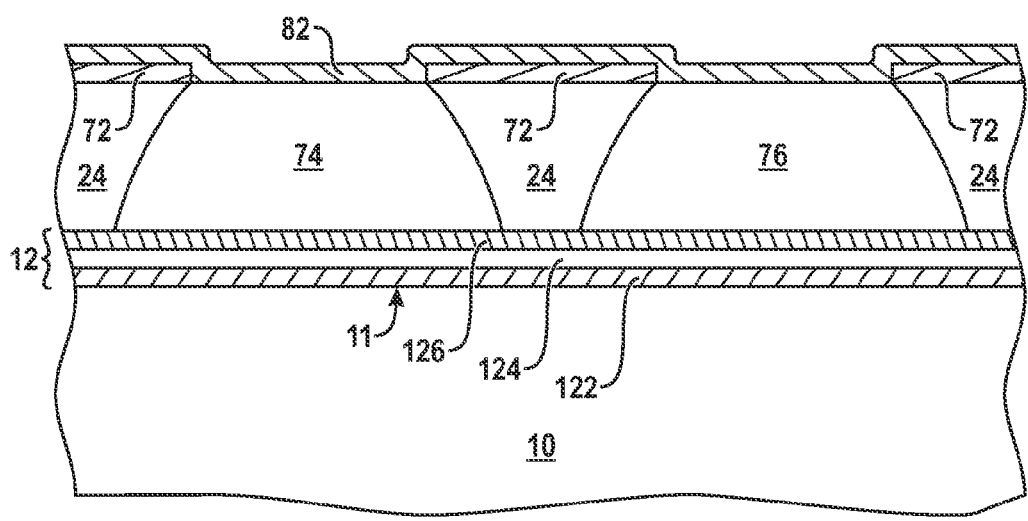
FIG. 8 includes an illustration of a cross-sectional view of the workpiece of FIG. 7 after an insulating layer over the patterned hard mask layer.

A sacrificial layer 82 is formed over the mask features 72 and the doped regions 74 and 76, as illustrated in FIG. 8. The sacrificial layer 82 will be used to form spacers that are subsequently used in defining gate electrodes. The sacrificial layer 82 can have a composition different from the mask features 72 and the doped regions 74 and 76. In one embodiment, the sacrificial layer 82 can include an oxide when an uppermost surface of the mask features 72 include a nitride or an oxynitride and the doped regions 74 and 76 are principally a semiconductor material (e.g., silicon, germanium, or the like). The thickness of the sacrificial layer 82 can determine how wide the subsequently formed are, and in one embodiment, the thickness of the sacrificial layer 82 may be no thicker than the mask features 72. The sacrificial layer 82 can be formed using a conventional or proprietary conformal deposition.

Figure 9:
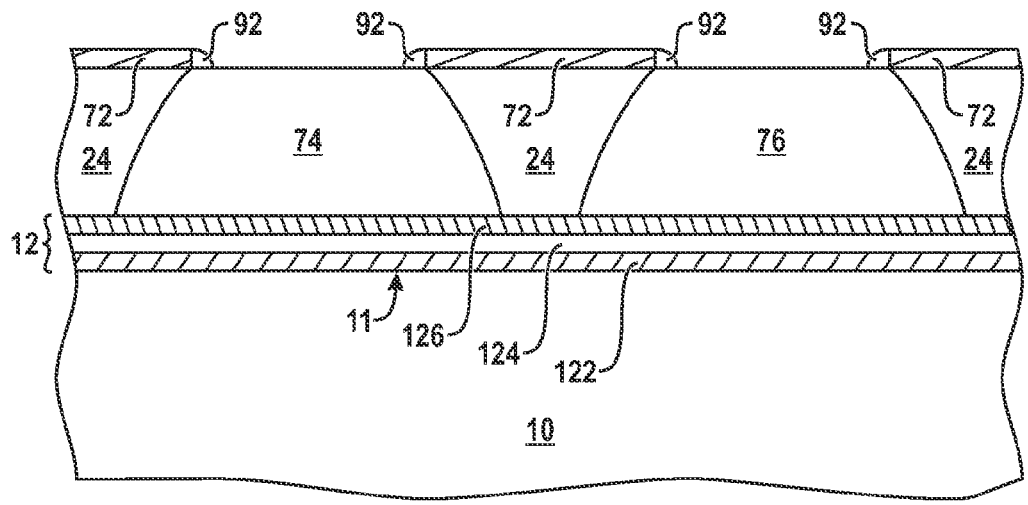
FIG. 9 includes an illustration of a cross-sectional view of the workpiece of FIG. 8 after forming spacers adjacent to mask features.

The sacrificial layer 82 is anisotropically etched to form spacers 92, as illustrated in FIG. 9. The width of the spacers 92, as measured along the base of the spacers (i.e., along the interface with the doped region 74 or 76) may be approximately the same as the thickness of the sacrificial layer 82. In another embodiment, the spacers 92 may be thinner along the base as compared to the thickness as deposited, particularly when the spacers 92 are significantly overetched or the sacrificial layer 82 was formed to a thickness thicker than the mask features 72. The anisotropic etch is performed using a conventional or proprietary etching technique.

Figure 10:
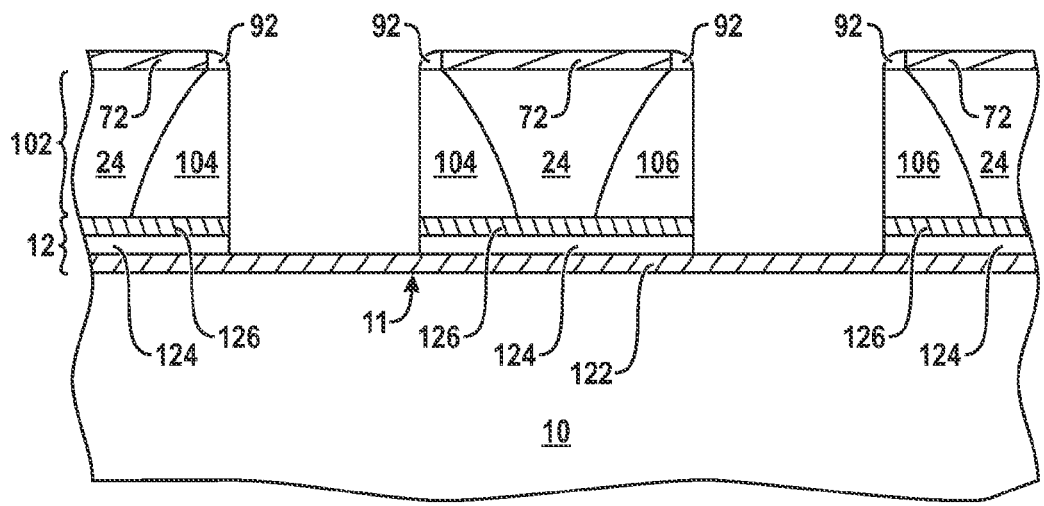
FIG. 10 includes an illustration of a cross-sectional view of the workpiece of FIG. 9 after patterning portions of doped regions within the semiconductor layer and portions of the charge storage stack.

FIG. 10 includes a cross-sectional view after the patterning exposed portions of the doped regions 74 and 76 to form doped semiconductor strips 102. The doped semiconductor strips 102 include edge portions 104 and 106, which are remaining portions of the doped regions 74 and 76, and a central portion that includes the doped semiconductor layer 24 outside of the doped regions 74 and 76. The widths of the doped semiconductor strips correspond to a dimension of the finished gate electrodes. In a particular embodiment, the patterning can be continued to etch portions of the insulating layer 126 and the charge storage layer 124 and stop on or within the gate dielectric layer 122, as illustrated in FIG. 10. In another embodiment, the gate dielectric layer 122 may also be etched, and in still another embodiment, the charge storage layer 124 or the insulating layer 126 may not be patterned.

The patterning can be performed by selectively etching the affected layers. When the doped regions 74 and 76 are etched, the etching gas can include a fluorine-containing gas, a chlorine-containing gas, a bromine-containing gas, or any combination thereof. The etching gas can also include hydrogen, which may be incorporated as a separate gas or part of a halogen-containing gas. An exemplary feed gas for etching can include $CF_4$, $CHF_3$, $C_2F_6$, $NF_3$, $SF_6$, HCl, $Cl_2$, HBr, $Br_2$, another suitable halogen-containing gas or any combination thereof. The feed gas may also include an oxygen-containing gas, such as $O_2$, $O_3$, another suitable oxygen-containing gas, or any combination thereof. The feed gas may also include a diluent, such as a noble gas (helium, neon, argon, or the like). The pressure, radio-frequency ("RF") power, and gas flow rates may depend on the size of the substrates or etch chamber, the etch equipment configuration, or another factor.

Etching of the doped regions 74 and 76 can be performed as a single act or as a sequence of actions. In an embodiment, the etch sequence can include a breakthrough portion to etch a surface oxide or another contaminant, a bulk etch portion that is used to etch most of the thickness of the doped regions 74 and 76, an endpoint portion that is used when reaching the underlying insulating layer 126, and an overetch portion. None, some, or all of the etching parameters may be changed between the different portions of the etch sequence. For example, the feed gases used for the endpoint portion may be different from the bulk etch portion because the endpoint portion is more selective to oxide. A lower RF power or electrical field may be used during the overetch portion. After reading this specification, skilled artisans will be able to tailor the etch of the doped regions 74 and 76 to their needs or desires for their particular applications.

The insulating layer 126 and the charge storage layer 124 can be patterned by dry etching the layers. The etch chemistry used to etch each layer may depend on the composition that particular layer. For example, when the insulating layer 26 includes an oxide, the insulating layer 126 can be etched using an etch chemistry tailored for an oxide, and when the charge storage layer 124 includes a nitride, the charge storage layer 124 can be etched using an etch chemistry tailored for a nitride. The feed gases for etching can include any one or more of the gases described with respect to the doped regions 74 and 76. In a particular embodiment, the insulating layer 126 and the charge storage layer 124 can be etched using a fluorine-containing gas, but may not be etched using a chlorine-containing or bromine-containing gas. If needed or desired, an oxygen-containing gas, a diluent, or any combination thereof can be used during etching. The pressure, radio-frequency ("RF") power, and gas flow rates may depend on the size of the substrates or etch chamber, the etch equipment configuration, or another factor. In a particular embodiment, one or more etching parameters can be changed after the insulating layer 126 has been patterned and when etching the charge storage layer 124.

Each of the insulating layer 126 and the charge storage layer 124 can be etched during a single act or as a sequence of actions. In an embodiment, the etch can include a timed etch, an endpoint etch, or an endpoint portion combined with a timed overetch portion. A lower RF power or electrical field may be used during the overetch portion. After reading this specification, skilled artisans will be able to tailor the etch of the insulating layer 126 and the charge storage layer 124 to their needs or desires for their particular applications. In a particular embodiment, the mask features 72 and the spacers 92 may be thinned when etching the insulating layer 126, the charge storage layer 124, or both; however, the mask features 72 and the spacers 92 can have a sufficient thickness so that they are not completely removed.

Figure 11:
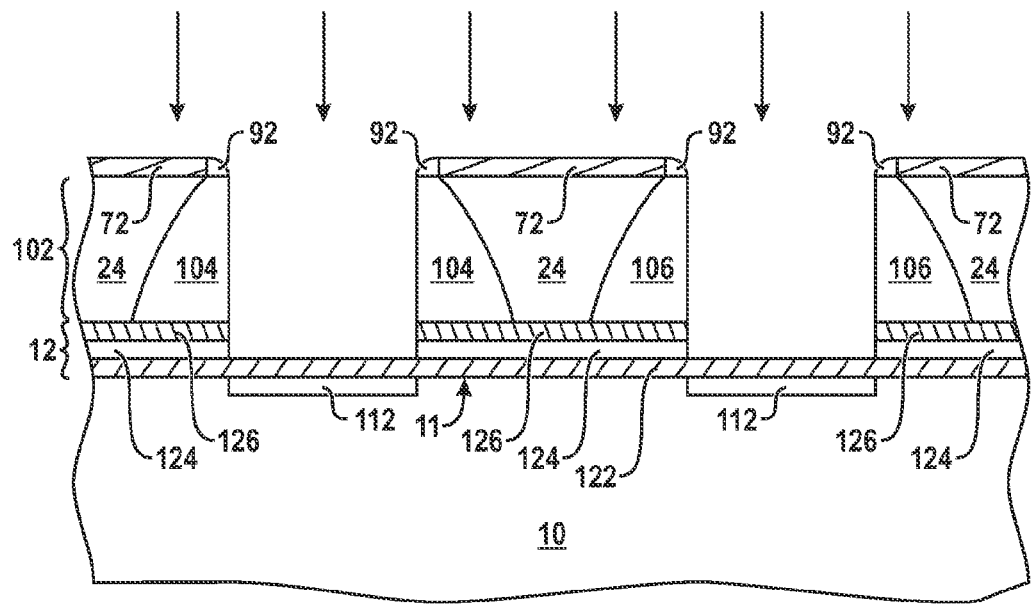
FIG. 11 includes an illustration of a cross-sectional view of the workpiece of FIG. 10 after implanting portions of the substrate.

FIG. 11 includes a cross-sectional view after doping portions 112 of the substrate 10 that are not covered by the doped semiconductor strips 102. The dopants used to form the doped regions may vary depending on the electrical performance of the nonvolatile memory cells being formed. In an embodiment, buried bit lines and pocket regions can be formed. The buried bit lines can act as source/drain regions for the nonvolatile memory cells being formed and can have a conductivity type that is opposite the substrate 10, the remaining portions of the doped semiconductor layer 24, and pocket regions, and have a conductivity type that is the same as the doped edge portions 104 and 106 of the doped semiconductor strips. An n-type dopant, such as phosphorus, arsenic, or another suitable n-type dopant can be used. The pocket regions (also called halo regions) can be used to increase the electrical field near the buried bit lines when the nonvolatile memory cell is being programmed. The pocket regions can include a p-type dopant, such as boron or the like. In a particular embodiment, the buried bit lines are doped with arsenic, and the pocket regions are doped with boron.

Ion implantation can be used to dope the substrate 10 when forming the buried bit lines and the pocket regions. For the buried bit lines, the ions can include $P^+_{31}$, $As^+_{75}$, or the like. In a particular embodiment, the dose may be no greater than approximately 1E16 ions/cm$^2$, 7E15 ions/cm$^2$, or 5E15 ions/cm$^2$, and in another embodiment, the dose can be at least approximately 2.5E14 ions/cm$^2$, 7E14 ions/cm$^2$, or 1E15 ions/cm$^2$. In a particular embodiment, the dose can be in a range of approximately 1E15 ions/cm$^2$ to approximately 5E15 ions/cm$^2$. When the ions include $As^+_{75}$, the implant energy may be no greater than approximately 40 keV, 35 keV, or 30 keV, and in another embodiment, the implant energy can be at least approximately 5 keV, 10 keV, or 15 keV. In a particular embodiment, the implant energy can be in a range of approximately 10 keV to approximately 30 keV. When the ions include $P^+_{31}$, the implant energy may be lower than it is for $As^+_{75}$.

For the pocket regions, the ions can include $B^+_{11}$, $BF_2^+$, or the like. In a particular embodiment, the dose may be no greater than approximately 1E14 ions/cm$^2$, 7E13 ions/cm$^2$, or 5E13 ions/cm$^2$, and in another embodiment, the dose can be at least approximately 1E12 ions/cm$^2$, 2E12 ions/cm$^2$, or 5E12 ions/cm$^2$. In a particular embodiment, the dose can be in a range of approximately 5E12 ions/cm$^2$ to approximately 5E13 ions/cm$^2$. When the ions include $B^+_{11}$, the implant energy may be no greater than approximately 25 keV, 23 keV, or 20 keV, and in another embodiment, the implant energy can be at least approximately 1 keV, 3 keV, or 5 keV. In a particular embodiment, the implant energy can be in a range of approximately 5 keV to approximately 20 keV. When the ions include $BF_2^+$, the implant energy may be higher than it is for $B^+_{11}$.

An angle at which the ions are directed to the substrate 10 can be in a direction substantially perpendicular to the primary surface 11 of the substrate 10. In another embodiment, the angle can be up to approximately 7°. In still another embodiment, the angle can be at least 8°. In a particular embodiment, the ions for the buried bit lines can be implanted at an angle no greater than approximately 7°, and the ions for the pocket regions can be implanted at an angle of at least approximately 8° to allow the ions of the pocket regions to be implanted farther under the conductive strips 102. Other angles and combinations of angles can be used as needed or desired.

After reading this specification, skilled artisans will be able to determine particular doping species, doses, and implant energies to achieve the needed or desired electrical characteristics. All other parameters for the ion implantation are conventional or proprietary.

The remaining portions of the mask features 72 and the spacers 92 are removed using a conventional or proprietary technique. The exposed portions of the gate dielectric layer 122 may also be removed. The workpiece can be annealed to activate the dopants within the doped regions 112 using a conventional or proprietary technique.

Figure 12:
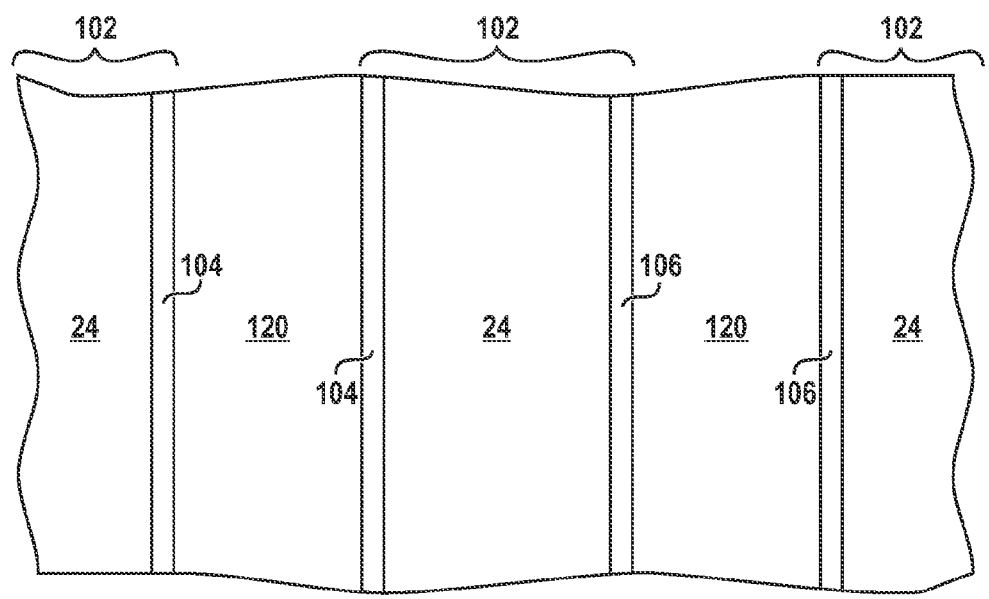
FIG. 12 includes an illustration of a top view of the workpiece of FIG. 11 after removing the spacers and mask features.

FIG. 12 includes a top view of the workpiece at this point in the process. The doped semiconductor strips 102 include remaining portions of the doped semiconductor layer 24 and an edge portion 104, an edge portion 106, or both edge portions. Note than significant parts of the edge portions 104 and 106 are exposed along the uppermost surfaces of the doped semiconductor strips 102. These parts of the edge portions 104 and 106 can allow for a good electrical connection to subsequently formed conductive members.

The buried bit lines 120 lie within the substrate 10 and include portions that lie between the conductive strips 102 in the embodiment as illustrated in FIG. 12. Portions (not illustrated in FIG. 12) of the buried bit lines 120 diffuse under portions of the doped semiconductor strips 102. The pocket regions are not illustrated in FIG. 12 and the remaining figures to simplify understanding of the concepts described herein. The pocket regions can lie farther under the conductive strips 102, as compared to the buried bit lines 120, and may or may not diffuse deeper in the substrate 10 (farther from the primary surface 11) than the buried bit lines 120.

Figure 13:
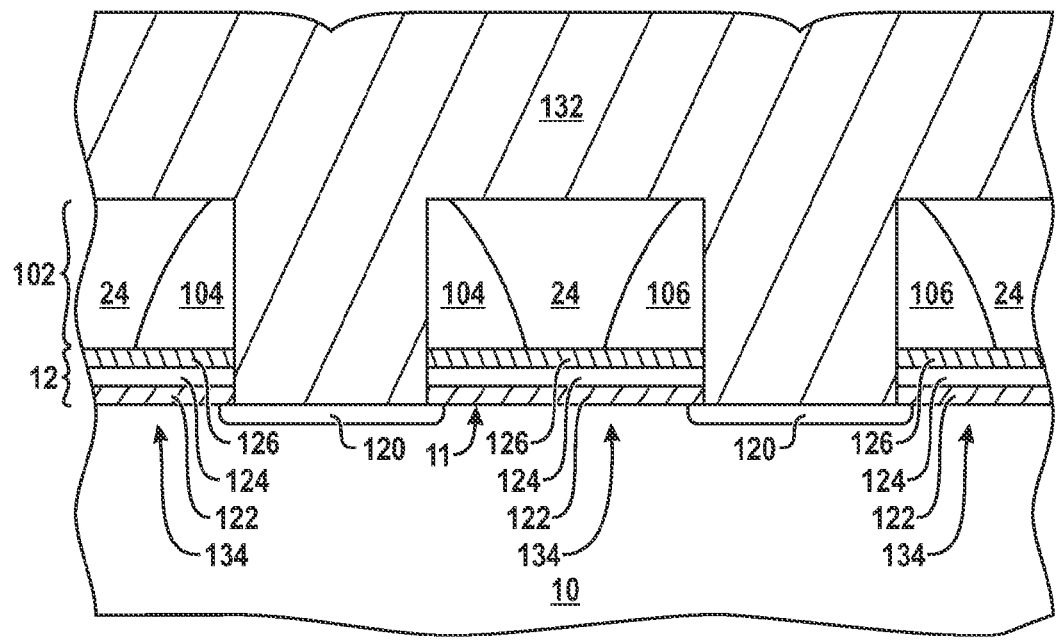
FIG. 13 includes an illustration of a cross-sectional view of the workpiece of FIG. 12 after forming an insulating layer over the substrate.
Figure 14:
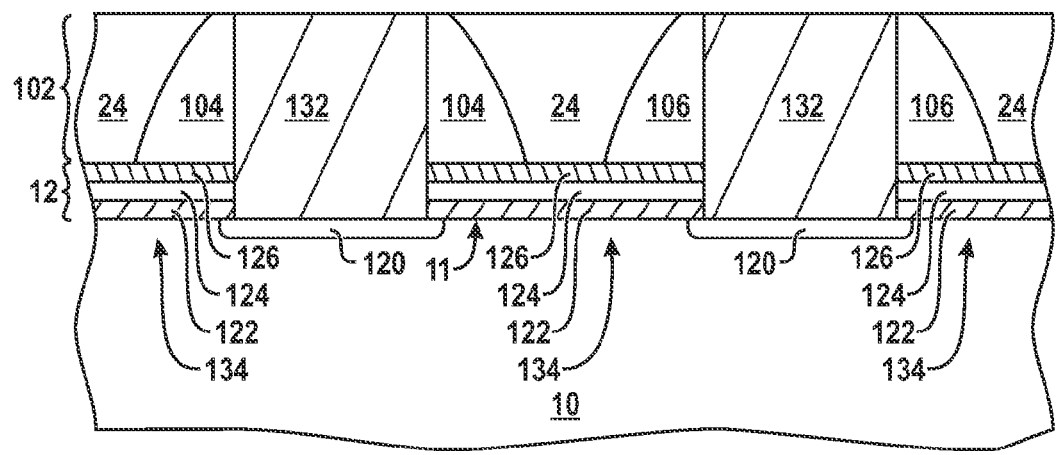
FIG. 14 includes an illustration of a cross-sectional view of the workpiece of FIG. 13 after removing portions of the insulating layer.

An insulating layer 132 is formed over the doped semiconductor strips 102 and buried bit lines 120, as illustrated in FIG. 13. Portions of the substrate 10 between the buried bit lines 120 are channel regions 134. The insulating layer 132 can include an oxide, a nitride, an oxynitride, or any combination thereof, and can be a single film or a plurality of films. The insulating layer 132 has a thickness sufficient to fill the gaps between the doped semiconductor strips 102. The insulating layer 132 can be deposited to a thickness such that the uppermost surface is undulating, as illustrated in the embodiment of FIG. 13, or has a substantially planar surface (not illustrated). The insulating layer 132 can be formed by a conventional or proprietary deposition.

Portions of the insulating layer 132 overlying the doped semiconductor strips 102 are removed to expose the uppermost surfaces of the doped semiconductor strips 102. The portions of the insulating layer 132 can be removed using a conventional or proprietary polishing or etch back technique. The surface of the workpiece can be substantially planar at this point in the process.

Figure 15:
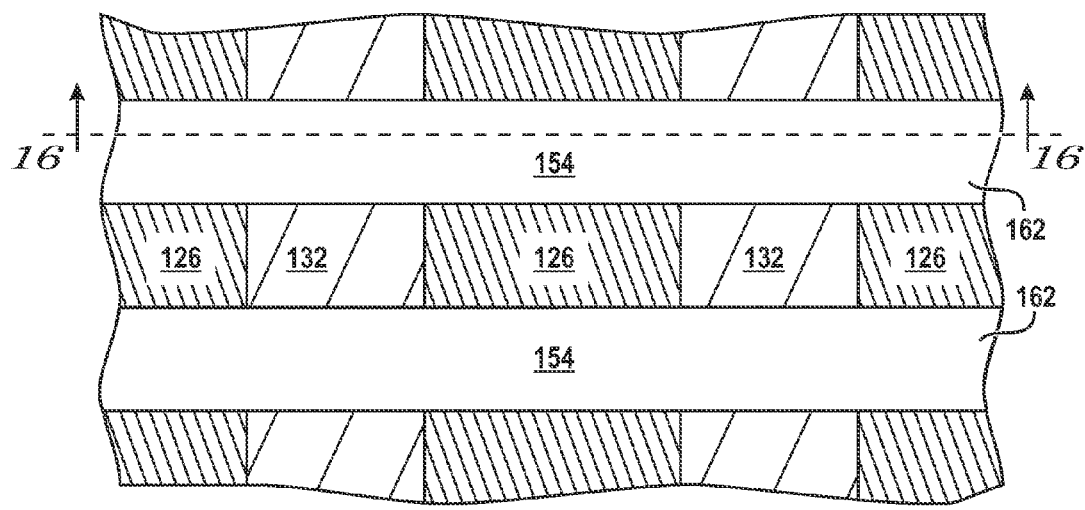
FIGS. 15 and 16 include illustrations of a top view and a cross-sectional view, respectively, of the workpiece of FIG. 14 after forming word lines.

A conductive layer is formed over the doped semiconductor strips 102 and the remaining portions of the insulating layer 132. The conductive layer 102 and doped semiconductor strips 102 are patterned to form word lines 154 as illustrated in FIGS. 15 (top view) and 16 (cross-sectional view along sectioning line 16-16 in FIG. 15).

The conductive layer can include a doped semiconductor material, a metal, a metal nitride, a suitable gate electrode material, or any combination thereof. In a particular embodiment, the conductive layer can be formed by depositing a semiconductor layer that includes silicon, germanium, carbon, or any combination thereof. In an embodiment, the semiconductor layer can have a thickness no greater than approximately 900 nm, 500 nm, or 200 nm, and in another embodiment, the semiconductor layer 14 can have a thickness of at least approximately 20 nm, 50 nm, or 100 nm. In a particular embodiment, the semiconductor layer has a thickness in a range of approximately 100 nm to approximately 150 nm. The semiconductor layer can be deposited using a conventional or proprietary deposition technique.

The semiconductor layer can be doped to become a doped semiconductor layer. In an embodiment, the semiconductor layer can be doped by ion implanting the semiconductor layer with a dopant having the same conductivity type as the edge portions 104 and 106. In a particular embodiment, the ions include $P^+_{31}$, $As^+_{75}$, or the like. In another particular embodiment, the dose may be no greater than approximately 1E16 ions/cm$^2$, 7E15 ions/cm$^2$, or 5E15 ions/cm$^2$, and in another embodiment, the dose can be at least approximately 5E14 ions/cm$^2$, 1E15 ions/cm$^2$, or 5E15 ions/cm$^2$. In a particular embodiment, the dose can be in a range of approximately 1E15 ions/cm$^2$ to approximately 1E16 ions/cm$^2$. When the ions include $P^+_{31}$, the implant energy may be no greater than approximately 30 keV, 25 keV, or 20 keV, and in another embodiment, the implant energy can be at least approximately 3 keV, 5 keV, or 10 keV. In a particular embodiment, the implant energy can be in a range of approximately 10 keV to approximately 20 keV. When the ions include $As^+_{75}$, the implant energy may be higher than it is for $P^+_{31}$. After reading this specification, skilled artisans will be able to determine an implant energy for a particular ionic species to achieve the desired projected range. The ion implantation can be performed using a conventional or proprietary technique.

In another embodiment, the semiconductor layer can be doped using a conventional or proprietary furnace doping technique. In still another embodiment, the conductive layer can be deposited as an in-situ doped semiconductor layer. The semiconductor layer, whether doped by implantation, furnace doped, in-situ doped, or any combination thereof, may be annealed before patterning, if needed or desired.

Figure 16:
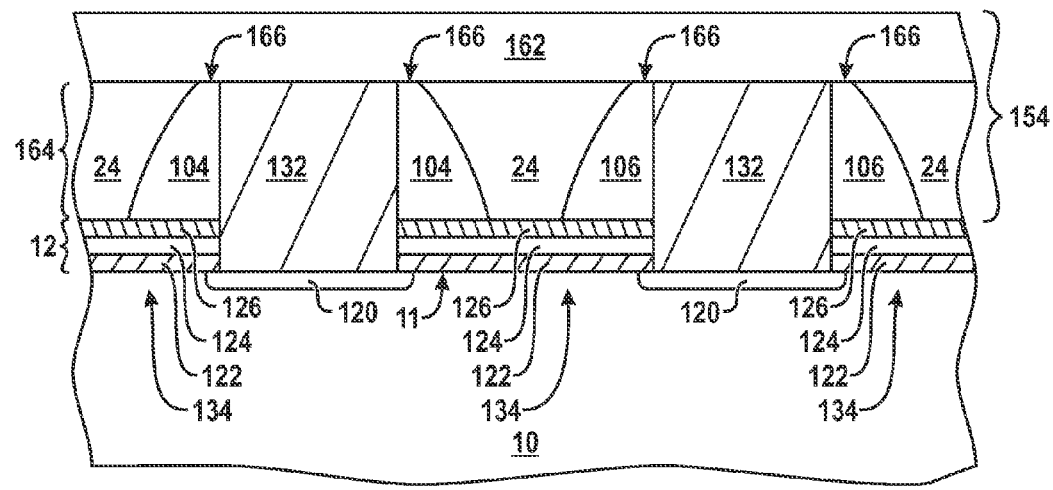

A patterned mask layer (not illustrated) can be formed over the conductive layer, and the conductive layer can be patterned to form conductive members 162. From a top view, the conductive members 162 have a shape substantially the same as the word lines 154. Portions of the doped semiconductor strips 102 are patterned to form gate electrodes 164, as illustrated in FIG. 16. Thus, the word lines 154 include the conductive members 162 and the gate electrodes 164. Referring to FIG. 15, the insulating layer 126 of the charge storage stack 12 is exposed in regions where portions of the doped semiconductor strips 102 have been removed. Therefore, in the embodiment as illustrated in FIG. 15, the gate electrodes 164 (remaining portions of the doped semiconductor strips 102) are not illustrated because they are covered by the conductive members 162. Referring to FIG. 16, the edge portions 104 and 106 are electrically connected to the conductive member 162 at the uppermost surfaces 166 of the doped regions 104 and 106. Portions of the buried bit lines 120 that are covered by the gate electrodes 164 are part of source/drain regions of the nonvolatile memory cells illustrated.

The patterning of the conductive layer to form the conductive members 162 and the patterning of the doped semiconductor strips 102 to form the gate electrodes 164 can be performed using by etching using any of the embodiments as described with respect to etching the doped regions 74 and 76 when forming the doped semiconductor strips 102. The etching of the conductive layer, the doped semiconductor strips 102, or both can be performed using the same or different etching parameters, as compared to each other and the doped semiconductor strips 102.

Although not illustrated, one or more interlevel dielectric layers and one or more interconnect levels may be formed to form a substantially completed electronic device. After forming all of the interlevel dielectric layers and interconnect levels, an encapsulating layer (not illustrated) is then formed over the uppermost level of interconnects. The encapsulating layer can include a single film or a plurality of films. The encapsulating layer can include an inorganic material, such as a silicon oxide, a silicon nitride, a silicon oxynitride, or any combination thereof. The formation of the interlevel dielectric layers, interconnect levels, and encapsulating layer can include a conventional or proprietary composition and be formed using a conventional or proprietary deposition technique.

Figure 17:
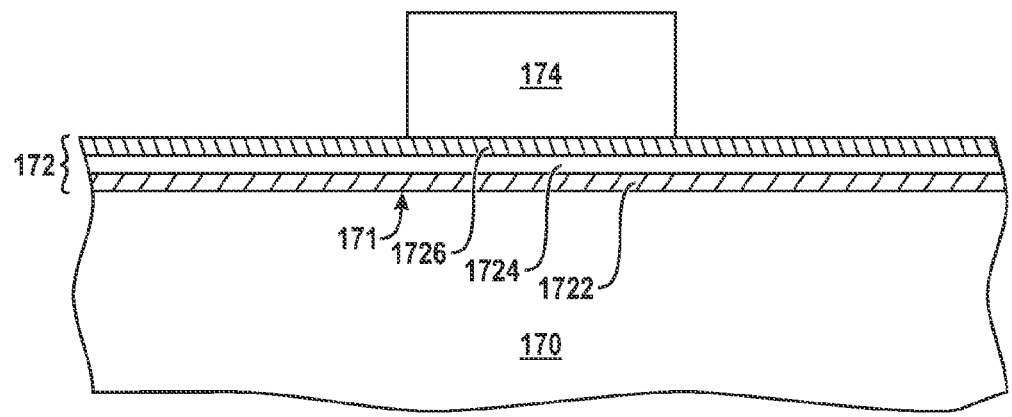
FIGS. 17 to 23 include illustrations of cross-sectional views of a portion of a workpiece wherein a gate electrode include an edge portion that is a doped spacer.

FIGS. 17 to 23 include an alternative embodiment, in which spacer structures can be used for the gate electrodes. FIG. 17 includes an illustration of a cross-sectional view of a portion of a workpiece that includes a substrate 170, a charge storage stack 172 and a doped semiconductor strip 174. The substrate 170 can include any of the materials as described with respect to the substrate 10. In a particular embodiment, the substrate 170 can include p-type doped silicon. The substrate 170 has a primary surface 171.

The charge storage stack 172 is formed over the substrate 170 and includes a gate dielectric layer 1722, a charge storage layer 1724, and an insulating layer 1726. The gate dielectric layer 1722, the charge storage layer 1724, and the insulating layer 1726 can include any of the materials, thicknesses and formation techniques as described with respect to the gate dielectric layer 122, the charge storage layer 124, and the insulating layer 126, respectively.

A doped semiconductor layer is formed over the charge storage stack 172 and patterned to form the doped semiconductor strip 174. The doped semiconductor layer can be formed using any of the materials, thicknesses and formation techniques as described with respect to the semiconductor layer 24. The doped semiconductor layer can be patterned using a technique similar to etching the doped regions 74 and 76; however, the spacers 92 are not needed, although they can be used if desired. After the doped semiconductor strip 174 is formed, any remaining mask features can be removed.

Figure 18:
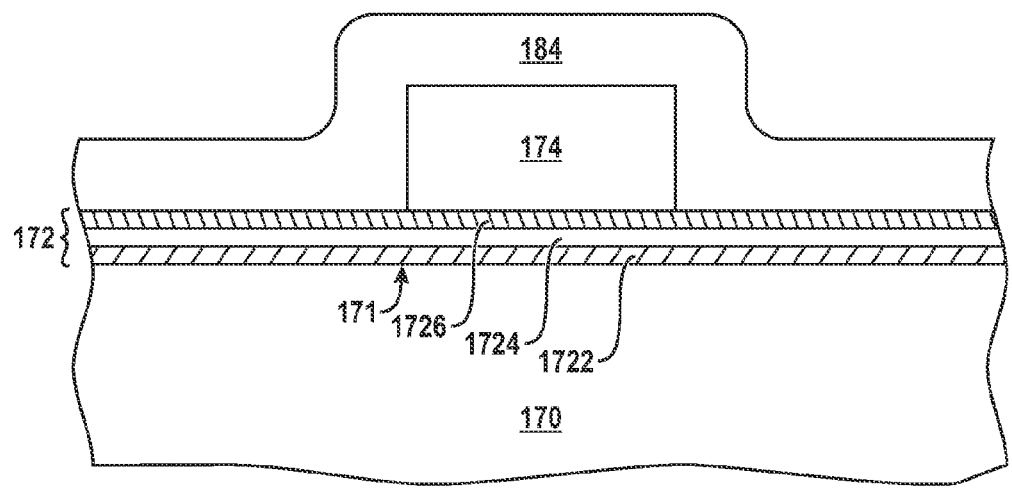

A doped semiconductor layer 184 can be formed over the doped semiconductor strip 174, as illustrated in FIG. 18. The doped semiconductor layer 184 is conformally deposited over the doped semiconductor strip 174 and charge storage stack 172. The doped semiconductor layer 184 can be formed using any of materials, thicknesses, and formation methods for the conductive members 162 when the conductive members 162 include a semiconductor material. Similar to the spacers 92, spacers subsequently formed from the doped semiconductor layer 184 will have a base dimension that can be similar to the thickness of the doped semiconductor layer 184, as deposited. In a particular embodiment, the doped semiconductor strip 174 and the doped semiconductor layer 184 have opposite conductivity types.

Figure 19:
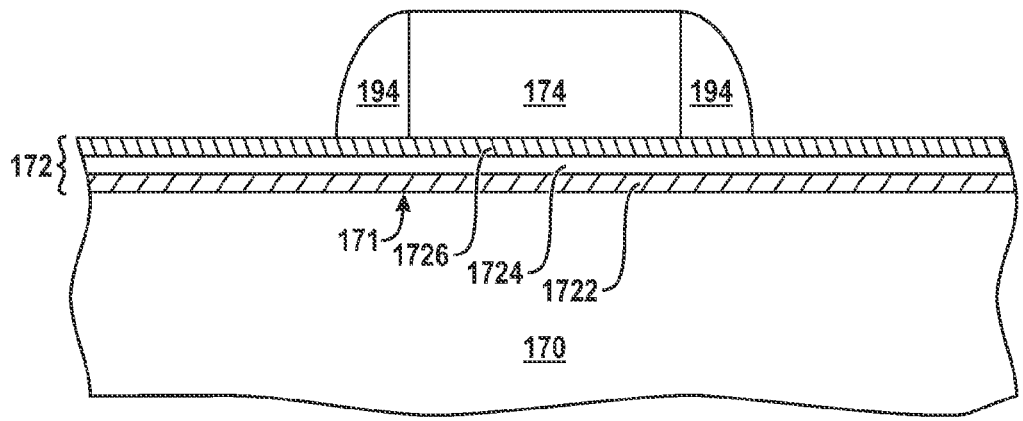
Figure 20:
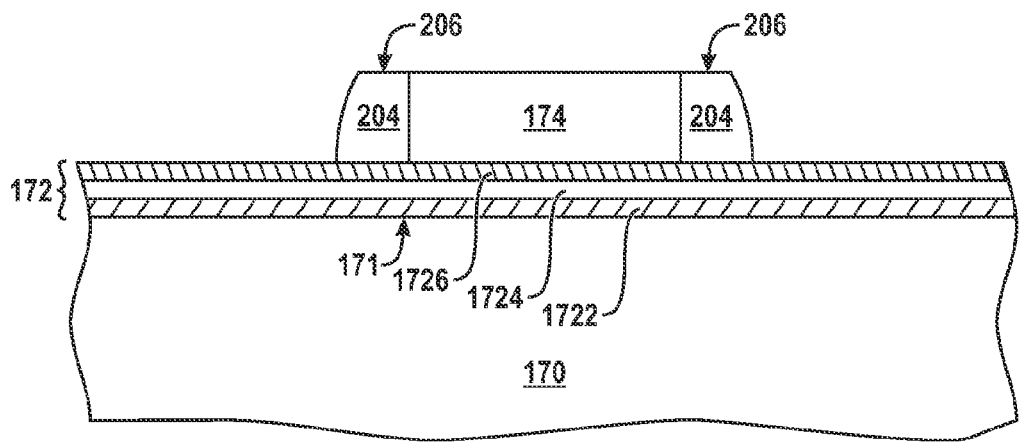

The doped semiconductor layer 184 is anisotropically etched to form the spacers 194, as illustrated in FIG. 19. The etching can be performed using any of the etch parameters as described with respect to the doped semiconductor strip 174. The spacers 194 have an arc-shaped outer surface in the embodiment as illustrated in FIG. 19. In another embodiment (not illustrated), the spacers can have a triangular or rectangular shape as seen in a cross-sectional view. If needed or desired, the spacers 194 can be overetched to form the spacers 204 having exposed upper surfaces 206, as illustrated in FIG. 20. The upper surfaces are substantially parallel to the primary surface 171. The exposed upper surfaces 206 can allow better electrically connection to a subsequently formed conductive member. In an alternative embodiment (not illustrated), dopant from the spacers 194 can be diffuse partly into the doped semiconductor strip 174, so that a portion of the upper surface of the doped semiconductor strip 174 would be counter doped. The diffusion would not be performed at a temperature or for a time that would cause counter doping within the center of the doped semiconductor strip 174.

Figure 21:
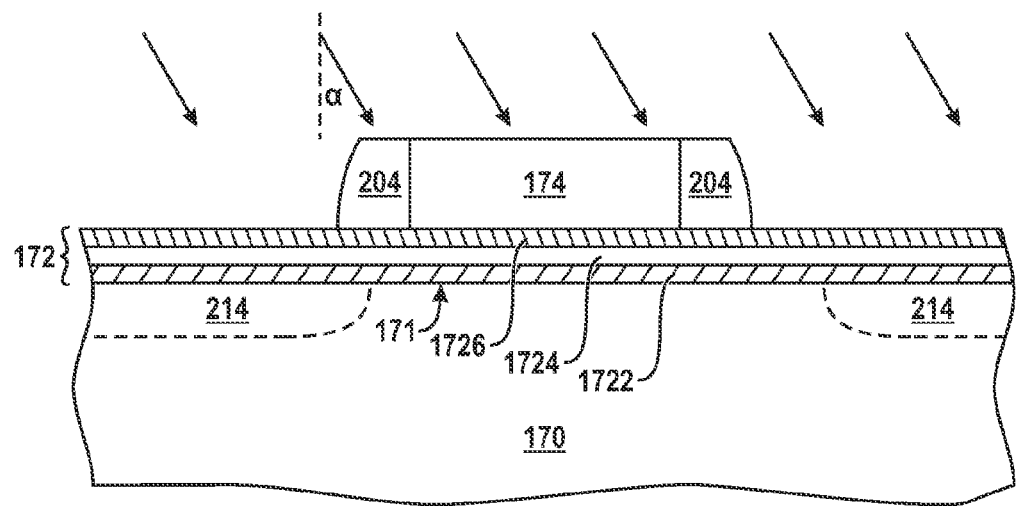
Figure 22:
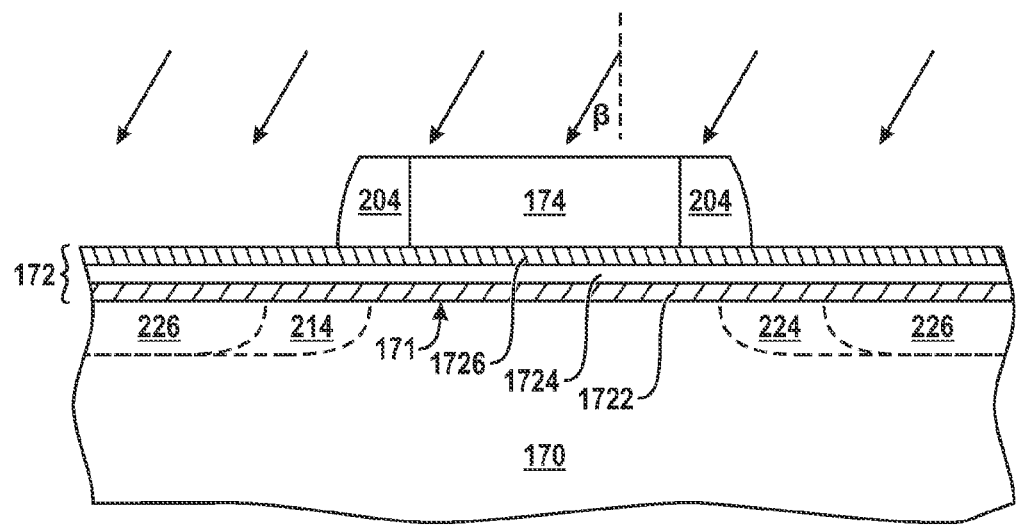

Buried bit lines and pocket regions can be formed after the spacers 204 are formed. The buried bit lines and pocket regions can be formed using any of the techniques previously described with respect to the buried bit lines 120 and pocket regions in a prior embodiment. The buried bit lines and pocket regions may be formed by implanting at an angle off of vertical, due to the presence of the spacers 204. In a particular embodiment, implants can be performed as illustrated in FIGS. 21 and 22. In FIG. 21, an angle γ can be any of the angles as described with respect to angle α. Implanted regions 214 can be formed within the substrate 214. In FIG. 21, an angle δ can be any of the angles as described with respect to angle β. Implanted regions 224 and 226 can be formed within the substrate 214. The implanted regions 226 include ions from both implantations. In another embodiment (not illustrated), the spacers can have a triangular cross-sectional shape, and a single implant can be performed an angle that is substantially perpendicular to the primary surface 171 or at an angle no greater than approximately 7° from perpendicular.

Figure 23:
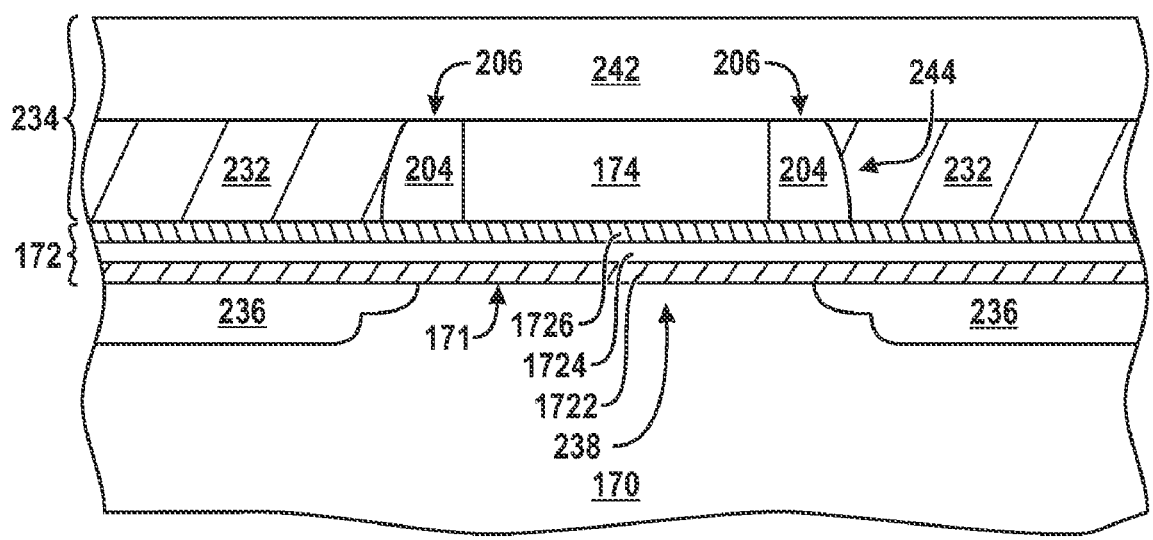

Processing is continued to produce nonvolatile memory cells, such as the cell illustrated in FIG. 23. An anneal is preformed to activate the implanted regions 214, 224, and 226 to form buried bit lines 236 and pocket regions (not illustrated). Portions of the substrate 170 between the buried bit lines 236 are channel regions 238. The formation of an insulating layer 232 and a word line 234, including a conductive member 242 and a gate electrode 244 (from the doped semiconductor strip 174), are similar to the formation of the insulating layer 132 and the word line 154, including the conductive member 162 and a gate electrode 164 (from the doped semiconductor strip 102). The spacers 204 are a type of edge portion of the gate electrode 244 and serve a function similar to the edge portions 104 and 106. The portion of the semiconductor strip 174 is a type of central portion of the gate electrode 244 and serves a function similar to the remaining portion of the doped semiconductor layer 24.

Memory cells formed using any of the embodiments as described herein can be used to form mirror-bit nonvolatile memory cells. The memory cells can be programmed, erased, read or any combination thereof can be performed using voltages on the buried bit lines 120 and words lines 154 that are conventional or proprietary for mirror-bit nonvolatile memory cells. For example, when programming a particular memory cell is performed by hot electron injection, the word line 154 may be at a voltage of approximately 8 volts to approximately 10 volts, a buried bit line 120 for the particular memory cell may be at approximately 4 volts to approximately 6 volts, and the other buried bit line 120 for the particular memory call may be at a voltage in a range of approximately 0 volt to approximately 1 volt.

When erasing of the particular memory cell is performed by hot hole injection, the word line 154 may be at a voltage of approximately −5 volts to approximately −7 volts, the bit line 120 of the particular memory cell closer to the bit being erased may be at approximately 4 volts to approximately 6 volts, and the other buried bit line 120 for the particular memory may be allowed to electrically float. In another embodiment, Fowler-Nordheim tunneling can be used to erase the memory cell.

Embodiments as described herein may be used to establish a higher electrical field at an overlap of the edge portion of the gate electrode at the corresponding channel region/buried bit line edge. When programming a particular bit of a memory cell, the full word line voltage can be transmitted to the edge portions. The electrons are more likely to be trapped in the regions where the edge portions overlie the charge storage layer, and less likely to be trapped within the central portion of the gate electrode. The trapped electron distribution is less likely to expand into or near the center of the channel region after the memory cells have been cycled many times. Thus, the electron distribution and hole distribution near a particular channel region/buried bit line edge are more aligned with each other.

Electronic devices as described herein can have better reliability. The operating window for nonvolatile memory cells in accordance with particular embodiments can be more robust to program-erase cycling. Also, each individual bit cell can be more robust to complimentary bit disturb. Also, mirror bit memory cells that include gate electrodes as described in any of the embodiments can remain robust, even as the memory cells are scaled to smaller dimensions.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a semiconductor layer over a substrate having a primary surface, wherein the semiconductor layer has a first conductivity type. The process can also include selectively doping a region of the semiconductor layer to form a first doped region having a second conductivity type opposite that of the first conductivity type. The process can further include patterning the semiconductor layer to form a gate electrode that includes a first portion and a second portion, wherein the first portion includes a portion of the first doped region, and the second region includes a portion of the semiconductor layer outside of the first doped region.

In an embodiment of the first aspect, selectively doping the region of the semiconductor layer includes selectively doping another region of the semiconductor layer to form a second doped region having the second conductivity type. Patterning the semiconductor layer to form the gate electrode can be performed such the gate electrode further includes a third portion, wherein the third portion includes a portion of the second doped region, and the second portion of the gate electrode is disposed between the first and third portions of the gate electrode. In a particular embodiment, the process further includes forming a gate dielectric layer over the substrate, forming a charge storage layer over the gate dielectric layer, and forming source/drain regions within the substrate after forming the gate electrode. In a more particular embodiment, the process further includes forming a conductive layer over the gate electrode, and patterning the conductive layer to forming a conductive member, wherein a word line includes the conductive member and the gate electrode.

In another particular embodiment of the first aspect, the process further includes forming a first patterned mask layer over the semiconductor layer before selectively doping the semiconductor layer. In a more particular embodiment, selectively doping the semiconductor layer includes ion implanting the semiconductor layer, wherein ions during ion implanting are directed towards the semiconductor layer at an angle greater than 8° from a direction perpendicular to the primary surface. In another more particular embodiment, the process further includes forming a spacer adjacent to an edge of a feature within the patterned first mask layer after selectively doping the substrate and before patterning the semiconductor layer.

In another embodiment of the first aspect, patterning the semiconductor layer includes selectively etching the semiconductor layer after forming the spacer. In a particular embodiment, the process further includes forming a second patterned mask layer, wherein forming the first patterned mask layer includes forming a mask layer after forming the semiconductor layer and before forming the second patterned mask layer, and selectively etching the mask layer while the second patterned mask layer overlies the mask layer to form the first patterned mask layer before selectively etching the semiconductor layer. In a more particular embodiment, the process further includes removing the second patterned mask layer after forming the first patterned mask layer, and annealing the semiconductor layer after removing the second patterned mask layer and before patterning the semiconductor layer.

In a second aspect, a process of forming an electronic device can include forming a gate dielectric layer over a substrate having a primary surface, forming a charge storage layer over the gate dielectric layer, wherein the charge storage layer includes a nitride layer, forming a semiconductor layer over the charge storage layer, and doping the semiconductor layer with a dopant having a first conductivity type. The process can also include forming a first patterned mask layer over the semiconductor layer and ion implanting the semiconductor layer at an angle greater than 8° from a direction perpendicular to the primary surface to form a first doped region and a second doped region, wherein each of the first and second doped regions has a second conductivity type opposite that of the first conductivity type. The process can further include patterning the semiconductor layer to form gate electrodes that each include a first portion, a second portion, and a third portion, wherein the first portion includes a portion of the first doped region, the second portion includes a portion of the semiconductor layer outside of the first and second doped regions, and the third portion includes a portion of the second doped region. The process further includes forming source/drain regions within the substrate after patterning the semiconductor layer, forming an insulating layer over the gate electrode and the source/drain regions, and removing a portion of the insulating layer overlying the gate electrodes. The process can still further include forming a conductive layer over the gate electrodes, and patterning the conductive layer to form conductive members that are electrically connected to the first and third portions of the gate electrodes, wherein word lines include the conductive members and the gate electrodes.

In an embodiment of the second aspect, ion implanting the semiconductor layer includes ion implanting for a first time at a first angle greater than 8° from the direction perpendicular to the primary surface, rotating the substrate, and ion implanting for a second time at a second angle greater than 8° from the direction perpendicular to the primary surface during or after rotating the substrate. In another embodiment, the process further includes forming spacers adjacent to edges of features within the patterned first mask layer after selectively doping the substrate and before patterning the semiconductor layer.

In a third aspect, an electronic device can include a first source/drain region, a second source/drain region spaced apart from the first source/drain region, and a channel region disposed between the first and second source drain regions. The electronic device can also include a gate electrode having a first edge portion, a second edge portion, and a central portion disposed between the first and second edge portions, wherein the central portion has a first conductivity type, and the first and second edge portions have a second conductivity type opposite the first conductivity type, the central portion is disposed over the channel region, the first edge region is at least partly disposed over the first source/drain region, and the second edge region is at least partly disposed over the second source/drain region.

In an embodiment of the third aspect, the electronic device further includes a gate dielectric layer disposed between the channel region and the gate electrode, wherein along a surface of the gate electrode closest to the gate dielectric layer, the central portion of the gate electrode overlies substantially none of the first and second source/drain region, the first edge region of the gate electrode is at least partly disposed over the channel region, and the second edge region of the gate electrode is at least partly disposed over the channel region. In a particular embodiment, the channel region has the first conductivity type, and the first and second source/drain regions have the second conductivity type. In another particular embodiment, the electronic device further includes a charge storage layer, wherein the charge storage layer is disposed between the gate dielectric layer and the gate electrode. In a more particular embodiment, the charge storage layer includes a nitride layer.

In a further embodiment of the third aspect, from a cross-sectional view of the gate electrode, the gate electrode is substantially rectangular. In still a further embodiment, the electronic device further includes a substrate having a primary surface, wherein from a cross-sectional view of the gate electrode, a first surface of the gate electrode closest to the primary surface is significantly longer than a second surface of the gate electrode farthest from the primary surface.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. An electronic device comprising:
    a first source/drain region;
    a second source/drain region spaced apart from the first source/drain region;
    a channel region disposed between the first and second source drain regions; and
    a gate electrode having a first edge portion, a second edge portion, and a central portion disposed between and abutting the first and second edge portions, wherein:
        the central portion has a first conductivity type, and the first and second edge portions have a second conductivity type opposite the first conductivity type;
        the central portion is disposed over the channel region, wherein the central portion is narrower at a first elevation closer to the channel region than at a second elevation further from the channel region;
        the first edge portion at least partly overlaps the first source/drain region, wherein the first edge portion is wider at the first elevation than at the second elevation; and
        the second edge portion at least partly overlaps the second source/drain region.

2. The electronic device of claim 1, wherein a boundary between the central portion and the first edge portion is in a shape of an arc.

3. The electronic device of claim 2, wherein the first edge portion has an uppermost flattened surface.

4. The electronic device of claim 1, wherein the first edge portion has an uppermost flattened surface.

5. The electronic device of claim 1, wherein the second edge portion is wider at the first elevation than at the second elevation.

6. The electronic device of claim 5, wherein boundaries between the central portion and the first edge portion and between the central portion and the second edge portion are in shapes of arcs.

7. The electronic device of claim 5, wherein:
    the first and second edge portions have flattened uppermost surfaces; and
    an uppermost surface of the central portion and the flattened uppermost surfaces lie along a same plane.

8. The electronic device of claim 7, further comprising a conductive member that directly contacts the flattened uppermost surfaces of the first and second edge portions and the uppermost surface of the central portion.

9. The electronic device of claim 1, wherein the central portion, the first edge portion, and the second edge portion are different portions of a same semiconductor layer.

10. The electronic device of claim 1, further comprising a substrate having a primary surface, wherein each the first and second edge portions have a surface opposite the central portion, wherein the surface is substantially perpendicular to the primary surface.

11. The electronic device of claim 1, further comprising a gate dielectric layer disposed between the channel region and the gate electrode, wherein along a surface of the gate electrode closest to the gate dielectric layer:
    the central portion of the gate electrode overlaps substantially none of the first and second source/drain region;
    the first edge portion of the gate electrode at least partly overlaps the channel region; and
    the second edge portion of the gate electrode at least partly overlaps the channel region.

12. The electronic device of claim 11, wherein the channel region has the first conductivity type, and the first and second source/drain regions have the second conductivity type.

13. The electronic device of claim 12, further comprising a charge storage layer, wherein the charge storage layer is disposed between the gate dielectric layer and the gate electrode.

14. The electronic device of claim 13, wherein the charge storage layer comprises a nitride layer.

15. The electronic device of claim 1, wherein from a cross-sectional view, the gate electrode is substantially rectangular.

16. The electronic device of claim 1, further comprising a substrate having a primary surface, wherein from a cross-sectional view, a first surface of the gate electrode closest to the primary surface is significantly longer than a second surface of the gate electrode farthest from the primary surface.

17. The electronic device of claim 1, wherein the second edge portion is wider at the first elevation than at the second elevation.

18. An electronic device comprising:
    a first source/drain region and a first pocket region, the first pocket region abutting the first source/drain region and a channel region, the first source/drain region having a first conductivity type, the first pocket region and the channel region having a second conductivity type opposite the first conductivity type;
    a second source/drain region spaced apart from the first source/drain region and a second pocket region, the second pocket region abutting the second source/drain region and the channel region, the second pocket region having the second conductivity type, and thea channel region disposed between the first and second source drain regions; and
    a gate electrode having a first edge portion, a second edge portion, and a central portion disposed between and abutting the first and second edge portions, wherein:
        the central portion and the first and second pocket regions have a first conductivity type, and the first and second edge portions have a second conductivity type opposite the first conductivity type;
        the central portion is disposed over the channel region;
        the first edge portion at least partly overlaps the first source/drain region; and
        the second edge portion at least partly overlaps the second source/drain region.

* * * * *